US009847372B2

(12) United States Patent
Rhodehouse

(10) Patent No.: US 9,847,372 B2
(45) Date of Patent: Dec. 19, 2017

(54) SOLID STATE TRANSDUCER DEVICES WITH SEPARATELY CONTROLLED REGIONS, AND ASSOCIATED SYSTEMS AND METHODS

(75) Inventor: Robert R. Rhodehouse, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 591 days.

(21) Appl. No.: 13/308,656

(22) Filed: Dec. 1, 2011

(65) Prior Publication Data

US 2013/0140994 A1 Jun. 6, 2013

(51) Int. Cl.
*H01L 33/32* (2010.01)
*H01L 33/36* (2010.01)
(Continued)

(52) U.S. Cl.
CPC ........ *H01L 27/156* (2013.01); *H01L 33/0025* (2013.01); *H01L 33/0033* (2013.01);
(Continued)

(58) Field of Classification Search
CPC ............. H01L 33/0025; H01L 33/0033; H01L 33/0062; H01L 33/0075; H01L 51/50; H01L 33/38; H01L 33/387
(Continued)

(56) References Cited

U.S. PATENT DOCUMENTS 5,491,712 A * 2/1996 Lin ........................ H01S 5/0264 372/50.21
5,574,744 A * 11/1996 Gaw .................. G02B 6/12004 257/E31.109

(Continued)

FOREIGN PATENT DOCUMENTS

JP 2001177152 A 6/2001
TW 200723561 A 6/2007

(Continued)

OTHER PUBLICATIONS

International Search Report and Written Opinion issued Feb. 28, 2013 in International Application No. PCT/US2012/066535, 12 pages.

(Continued)

*Primary Examiner* — Maliheh Malek
(74) *Attorney, Agent, or Firm* — Perkins Coie LLP

(57) ABSTRACT

Solid state transducer devices with independently controlled regions, and associated systems and methods are disclosed. A solid state transducer device in accordance with a particular embodiment includes a transducer structure having a first semiconductor material, a second semiconductor material and an active region between the first and second semiconductor materials, the active region including a continuous portion having a first region and a second region. A first contact is electrically connected to the first semiconductor material to direct a first electrical input to the first region along a first path, and a second contact electrically spaced apart from the first contact and connected to the first semiconductor material to direct a second electrical input to the second region along a second path different than the first path. A third electrical contact is electrically connected to the second semiconductor material.

16 Claims, 14 Drawing Sheets

(51) Int. Cl.
*H01L 33/38* (2010.01)
*H01L 27/15* (2006.01)
*H01L 33/00* (2010.01)

(52) U.S. Cl.
CPC ...... *H01L 33/0062* (2013.01); *H01L 33/0075* (2013.01); *H01L 33/382* (2013.01); *H01L 33/38* (2013.01)

(58) Field of Classification Search
USPC .......... 257/79, 88–91, 94–99, 200, E33.001, 257/E33.025, E33.028, E33.033–E33.034, 257/E33.049, E33.056–E33.059, 257/E33.005–E33.007, E33.062–E33.065; 438/22, 26, 28, 33–34, 47
See application file for complete search history.

(56) References Cited

U.S. PATENT DOCUMENTS 5,822,351 A * 10/1998 Kang .................... H01S 5/0264 372/46.01
5,892,786 A * 4/1999 Lott ...................... H01S 5/0264 372/50.124
5,963,568 A * 10/1999 Paoli ....................... H01S 5/423 372/23
6,277,651 B1 * 8/2001 Groger ................... G01N 21/39 257/253
6,445,007 B1 * 9/2002 Wu et al. ........................ 257/80
6,577,658 B1 * 6/2003 Lee ..................... H01S 5/18316 372/45.01
7,282,741 B2 * 10/2007 Kim et al. ...................... 257/79
7,528,417 B2 5/2009 Takeuchi et al.
7,542,493 B2 * 6/2009 Jewell ................... H01S 5/0612 372/33
7,683,475 B2 * 3/2010 Lee et al. ...................... 257/723
7,960,743 B2 6/2011 Doussiere
7,989,834 B2 * 8/2011 Park ................................ 257/98
D660,257 S * 5/2012 Andrews ............. H01L 25/0753 D13/180
8,242,509 B2 * 8/2012 Song ............................... 257/76
8,497,146 B2 * 7/2013 Odnoblyudov et al. ........ 438/33
8,552,452 B2 * 10/2013 Jeong et al. .................... 257/98
8,587,017 B2 * 11/2013 Kuo et al. ....................... 257/99
8,598,611 B2 * 12/2013 Odnoblyudov et al. ........ 257/98
8,637,897 B2 * 1/2014 Kim et al. .................... 257/103
8,653,547 B2 * 2/2014 Jeong ...................... H01L 33/22 257/84
8,680,560 B2 * 3/2014 Choi ....................... H01L 33/44 257/99
8,696,159 B2 * 4/2014 Andrews ............. H01L 25/0753 257/88
8,716,725 B2 * 5/2014 Yan ................................. 257/88
9,159,896 B2 * 10/2015 Odnoblyudov ......... H01L 33/62
2002/0063258 A1 * 5/2002 Motoki ........................... 257/95
2005/0110036 A1 * 5/2005 Park et al. ...................... 257/99
2005/0133807 A1 * 6/2005 Park et al. ...................... 257/99
2006/0203867 A1 * 9/2006 Imai ...................... H01S 5/2231 372/43.01
2006/0278892 A1 * 12/2006 Harris ................. H01L 29/7783 257/194
2007/0131958 A1 6/2007 Hsu et al.
2007/0194334 A1 * 8/2007 Honda ............................ 257/91
2007/0278508 A1 * 12/2007 Baur et al. ...................... 257/97
2008/0017878 A1 * 1/2008 Kuramoto ....................... 257/99
2008/0230792 A1 * 9/2008 Jiang et al. ..................... 257/94
2008/0279241 A1 * 11/2008 Oki ........................ B82Y 20/00 372/45.01
2008/0310472 A1 * 12/2008 Imai .......................... H01S 5/22 372/45.011
2009/0242924 A1 * 10/2009 Lin et al. ........................ 257/99
2009/0273003 A1 11/2009 Park
2010/0032704 A1 * 2/2010 Denbaars et al. .............. 257/98
2010/0072501 A1 * 3/2010 Wakai ..................... H01L 33/20 257/98
2010/0134047 A1 6/2010 Hasnain
2010/0176751 A1 * 7/2010 Oshio ..................... H01L 33/62 315/362
2010/0207123 A1 * 8/2010 Song ..................... H01L 33/387 257/76
2010/0207933 A1 8/2010 Suzuki et al.
2010/0259758 A1 * 10/2010 Asano ..................... H01L 27/15 356/479
2010/0259930 A1 * 10/2010 Yan .............................. 362/235
2010/0264443 A1 * 10/2010 Wakai ..................... H01L 33/20 257/98
2010/0283042 A1 * 11/2010 Katz ................... H01L 51/0053 257/40
2010/0283080 A1 11/2010 Margalith et al.
2011/0062482 A1 * 3/2011 Solomensky ....... H01L 25/0753 257/99
2011/0079813 A1 4/2011 Yeol et al.
2011/0095306 A1 * 4/2011 Hwang ................... H01L 33/38 257/79
2011/0114966 A1 * 5/2011 Liu et al. ........................ 257/76
2011/0163691 A1 7/2011 Dunn
2011/0186814 A1 * 8/2011 Kim ........................ H01L 33/20 257/13
2011/0198664 A1 * 8/2011 Kang ...................... H01L 33/14 257/100
2011/0235306 A1 * 9/2011 Li ....................... H01L 25/0753 362/84
2011/0248289 A1 * 10/2011 Hsieh et al. .................... 257/88
2011/0254044 A1 * 10/2011 Kuo et al. ....................... 257/99
2011/0260189 A1 * 10/2011 Kim ...................... H01L 33/405 257/98
2011/0278537 A1 * 11/2011 Lee .................. H01L 31/03046 257/13
2012/0032213 A1 * 2/2012 Sato ........................ H01L 33/38 257/98
2012/0037949 A1 * 2/2012 Jeong ...................... H01L 33/38 257/99
2012/0099610 A1 * 4/2012 Kono ..................... B82Y 20/00 372/18
2012/0164796 A1 * 6/2012 Lowenthal ............ H01L 25/048 438/127
2012/0286304 A1 * 11/2012 LeToquin et al. .............. 257/89
2012/0286307 A1 * 11/2012 Fang et al. ...................... 257/98
2012/0320581 A1 * 12/2012 Rogers et al. ................ 362/235
2012/0326159 A1 * 12/2012 Bergmann ............ H01L 33/405 257/76
2013/0020552 A1 * 1/2013 Kazama ................ H01L 33/405 257/13
2013/0032810 A1 * 2/2013 Chen ..................... H01L 33/007 257/76
2013/0032813 A1 * 2/2013 Kizilyalli ............ H01L 21/0254 257/76
2013/0032845 A1 * 2/2013 Chuang et al. ................. 257/99
2013/0037839 A1 * 2/2013 Kazama .................. H01L 33/38 257/98
2013/0087823 A1 * 4/2013 Tsai ........................ H01L 33/38 257/98
2013/0134838 A1 * 5/2013 Yun ....................... H01L 41/047 310/366
2013/0137225 A1 * 5/2013 Bour ................... H01L 21/0254 438/192
2013/0177036 A1 * 7/2013 Su ....................... H01S 5/18327 372/45.01
2013/0221384 A1 * 8/2013 Saito et al. ..................... 257/88
2013/0256710 A1 * 10/2013 Andrews et al. ............... 257/88
2013/0277702 A1 * 10/2013 Liu et al. ........................ 257/98
2013/0320370 A1 * 12/2013 Schubert et al. ............... 257/98
2014/0092391 A1 * 4/2014 Matsuu .................. H05B 37/02 356/479

(56) References Cited

U.S. PATENT DOCUMENTS

2015/0028375 A1* 1/2015 Kim et al. ........................ 257/98
2015/0179857 A1* 6/2015 Lin ..................... H01L 31/0687 136/255
2016/0365484 A1* 12/2016 Jeong ...................... H01L 33/22

FOREIGN PATENT DOCUMENTS

TW 201044903 A 12/2010
TW 201104916 A 2/2011
WO 2011014490 A2 2/2011
WO 2011038422 A2 3/2011
WO 2011057681 A1 5/2011
WO 2011073189 A2 6/2011

OTHER PUBLICATIONS

Office Action mailed Dec. 22, 2014 in Taiwan Application No. 101145128, 12 pages.

* cited by examiner

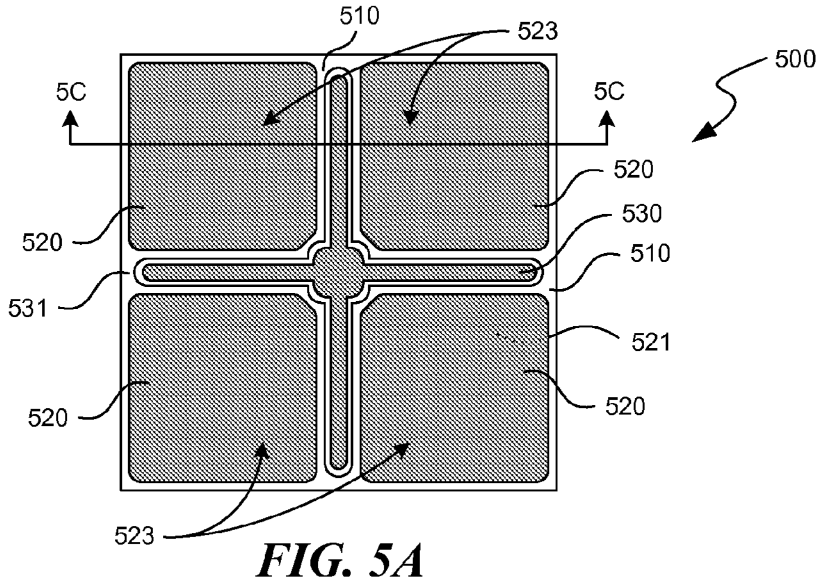
FIG. 5A
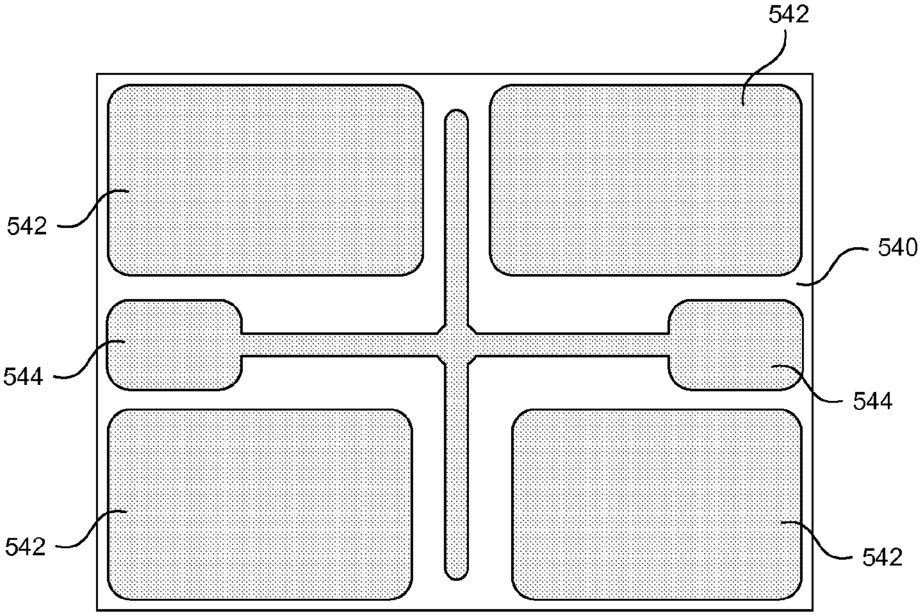
FIG. 5B
FIG. 5C
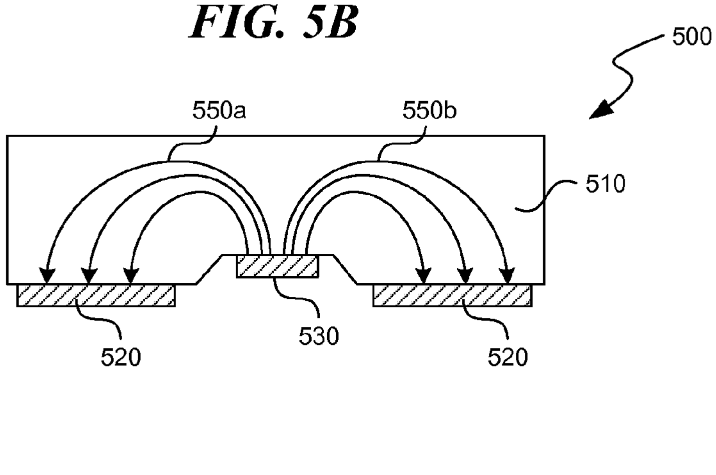

SOLID STATE TRANSDUCER DEVICES WITH SEPARATELY CONTROLLED REGIONS, AND ASSOCIATED SYSTEMS AND METHODS

TECHNICAL FIELD

The present technology is directed generally to solid state transducer devices having a plurality of discrete regions that can be separately controlled, and associated systems and methods.

BACKGROUND

Solid state transducer ("SST") devices are used in a wide variety of products and applications. For example, mobile phones, personal digital assistants ("PDAs"), digital cameras, MP3 players, and other portable electronic devices utilize SST devices for backlighting. SST devices are also used for signage, indoor lighting, outdoor lighting, and other types of general illumination. SST devices generally use light emitting diodes ("LEDs"), organic light emitting diodes ("OLEDs"), and/or polymer light emitting diodes ("PLEDs") as sources of illumination, rather than electrical filaments, plasma, or gas. FIG. 1A is a cross-sectional view of a conventional SST device 10*a* with lateral contacts. As shown in FIG. 1A, the SST device 10*a* includes a substrate 20 carrying an LED structure 11 having an active region 14, e.g., containing gallium nitride/indium gallium nitride (GaN/InGaN) multiple quantum wells ("MQWs"), positioned between N-type GaN 15 and P-type GaN 16. The SST device 10*a* also includes a first contact 17 on the P-type GaN 16 and a second contact 19 on the N-type GaN 15. The first contact 17 typically includes a transparent and conductive material, e.g., indium tin oxide ("ITO"), to allow light to escape from the LED structure 11. In operation, electrical power is provided to the SST device 10*a* via the contacts 17, 19, causing the active region 14 to emit light.

FIG. 1B is a cross-sectional view of another conventional LED device 10*b* in which the first and second contacts 17 and 19 are opposite each other, e.g., in a vertical rather than lateral configuration. During formation of the LED device 10*b*, a growth substrate (not shown), similar to the substrate 20 shown in FIG. 1A, initially carries an N-type GaN 15, an active region 14 and a P-type GaN 16. The first contact 17 is disposed on the P-type GaN 16, and a carrier 21 is attached to the first contact 17. The substrate is removed, allowing the second contact 19 to be disposed on the N-type GaN 15. The structure is then inverted to produce the orientation shown in FIG. 1B. In the LED device 10*b*, the first contact 17 typically includes a reflective and conductive material, e.g., silver or aluminum, to direct light toward the N-type GaN 15. An optional converter material and an encapsulant can then be positioned over one another on the LED structure 11. In operation, the LED structure 11 can emit energy at a first wavelength, e.g., blue light, that stimulates the converter material, e.g., phosphor, to emit energy at a second wavelength, e.g., yellow light. Energy at the first and second wavelengths is combined to generate a desired color of light, e.g., white light.

Conventional SST devices are made with a single, monolithic light delivery surface that receives a single voltage input and provides a single output across the lighting surface. Due to inherent manufacturing inconsistencies, the light output and efficiency of a given device may vary from one device to another, or within a given device. For example, the light output from devices made from a single wafer can vary as a function of the distance between the device and the center of the wafer or the edge of the wafer. For particular dies, e.g., large dies, the light output can vary across the surface of a single die, producing undesirable output variations.

Some conventional SST devices incorporate a die-level lens, such as a spotlight lens, that focuses or otherwise alters light output. A conventional monolithic lighting device, however, may produce light outside the lens area, which is not focused. Accordingly, conventional solid state transducer devices with die-level lenses are generally less than optimally efficient. Another drawback with conventional monolithic solid state transducer devices is the difficulty associated with controlling the heat generated in the device. During normal conditions, the lighting device may heat up irregularly due to manufacturing inconsistencies in the die itself, or due to the environment in which the device is employed. The typical response to excessive heating is to switch off the lighting device to avoid damaging it. However, this defeats the operational purpose of the device. Accordingly, there is a need in the art for an improved SST device.

BRIEF DESCRIPTION OF THE DRAWINGS

FIG. 5A is a partially schematic top view of a lateral flip SST device including first and second contacts at or proximate to a nonlighting surface of the SST device in accordance with embodiments of the present technology.

FIG. 5B is a partially schematic view of a support substrate for use with the SST device of FIG. 5A in accordance with embodiments of the present technology.

FIG. 5C is a partially schematic cross-sectional view of the SST device shown in FIGS. 5A and 5B taken substantially along line 5C-5C of FIG. 5A.

DETAILED DESCRIPTION

Specific details of several embodiments of SST devices with separately controlled lighting regions, and associated systems and methods are described below. The term "SST" generally refers to solid state transducers or other devices that include a semiconductor material as the active medium to convert between electrical energy and electromagnetic radiation in the visible, ultraviolet, infrared, and/or other spectra. For example, SST devices include solid state light emitters, e.g., LEDs, laser diodes, etc., and/or other sources of emission other than electrical filaments, plasmas, or gases. The term SST can also include solid state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 2A-8D and 10A-10C.

Figure 1A:
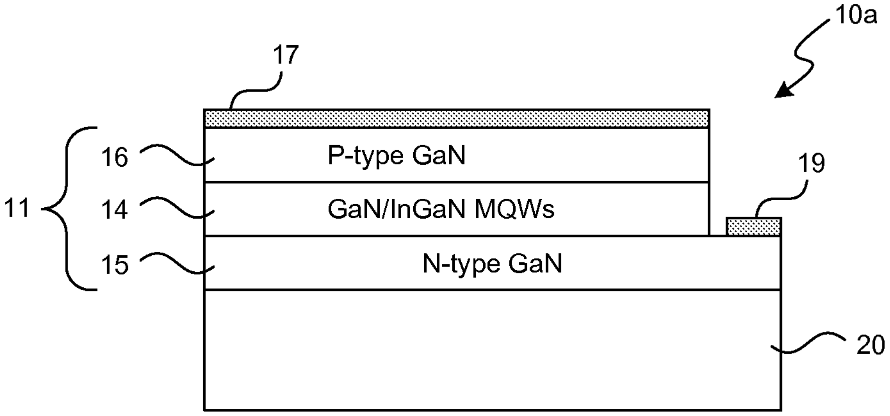
FIG. 1A is a partially schematic, cross-sectional diagram of an SST device having a lateral arrangement in accordance with the prior art.
Figure 1B:
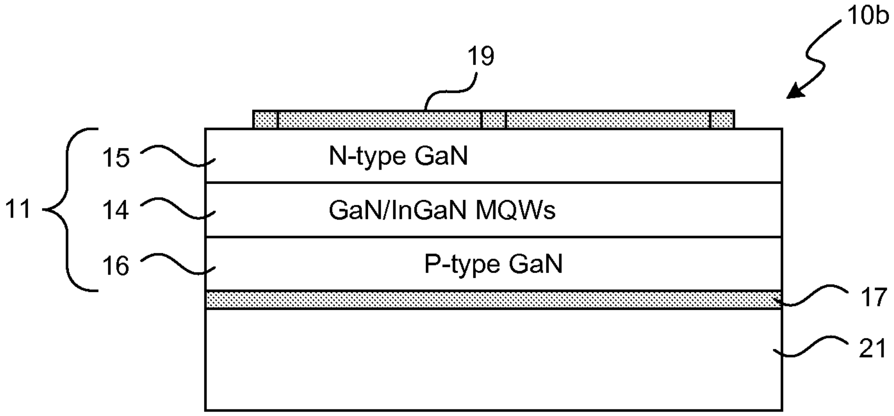
FIG. 1B is a partially schematic, cross-sectional diagram of another SST device having a vertical arrangement in accordance with the prior art.
Figure 2A:
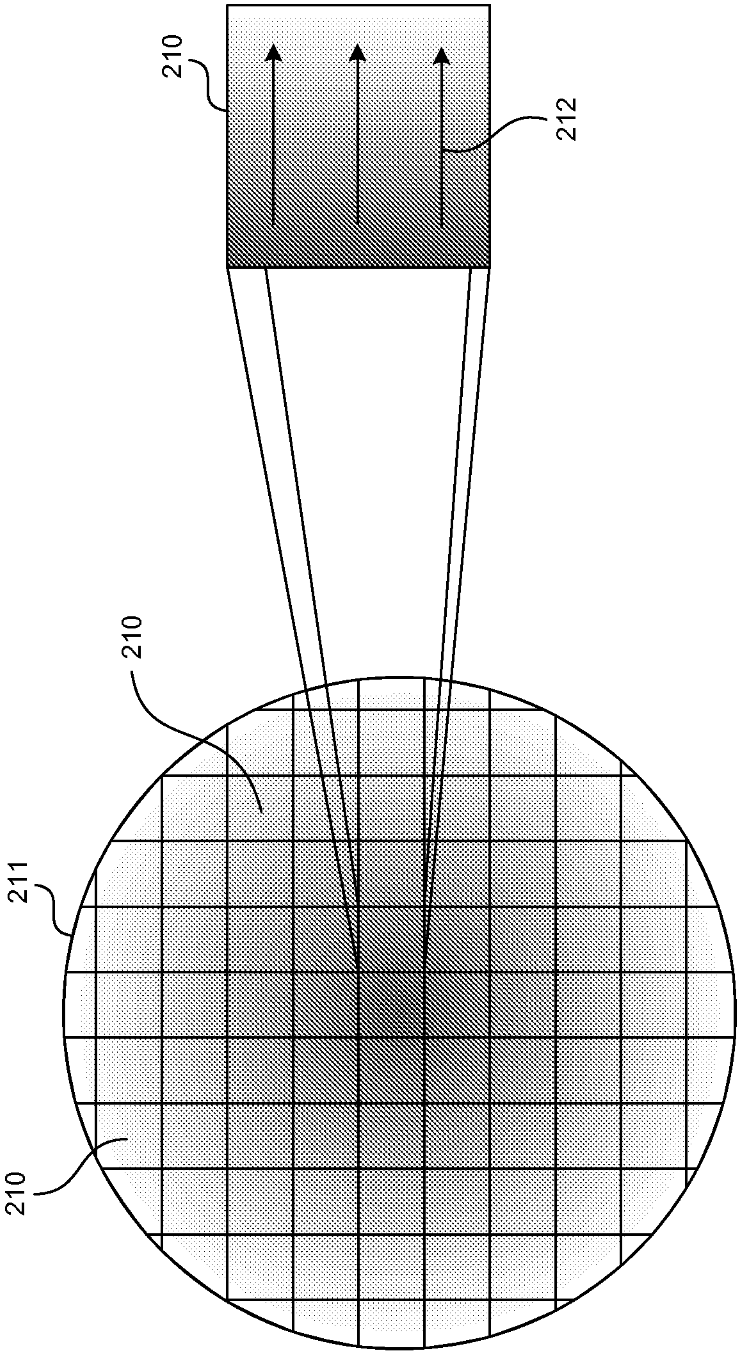
FIG. 2A is a partially schematic illustration of a wafer, along with an enlarged view of a singulated die from the wafer, in accordance with an embodiment of the present technology.

FIG. 2A is a top view of a wafer 211 having multiple dies 210, and an enlarged view of a single one of the dies 210. SSTs, like many semiconductor devices, are generally produced at the wafer level, and are then singulated into individual units such as the die 210. The manufacturing steps, however, are imperfect and can result in an uneven distribution of light-emitting characteristics over the wafer 211. For example, some dies 210 may have characteristics that vary as a function of radial position on the wafer 211. The variability of a representative characteristic is illustrated schematically in FIG. 2A by shading and arrows 212. One result of the foregoing variability is that the SSTs containing the dies produce different light qualities, and accordingly there are fewer "good" dies per wafer. The variability is therefore generally undesirable. As dies become larger, the effect is more pronounced for individual dies. The larger the individual dies are, the more noticeable the gradient or other variation across an individual die becomes. Some conventional techniques to address this problem include grouping dies with similar characteristics together (typically referred to as "binning"), e.g., based on the wafer position of the dies 210. For example, dies 210 produced from near the center of a wafer 211 can be placed in one group, and dies 210 produced from the periphery of the wafer 211 in another group. Another approach is to combine dies 210 having different, offsetting characteristics in a single array so that the differences between the dies 210 combine to produce an acceptable result. This approach, however, can result in a lower average light output when measured in the aggregate and is therefore less desirable.

Figure 2C:
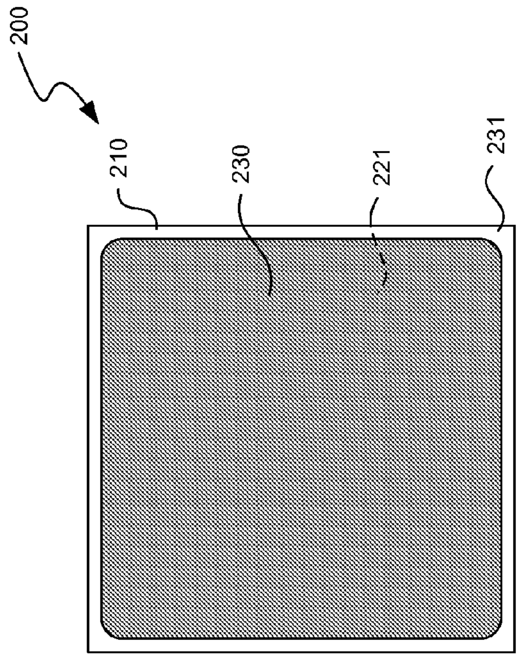
FIG. 2C is a partially schematic bottom view of the SST device shown in FIG. 2B, in accordance with embodiments of the present technology.
Figure 2B:
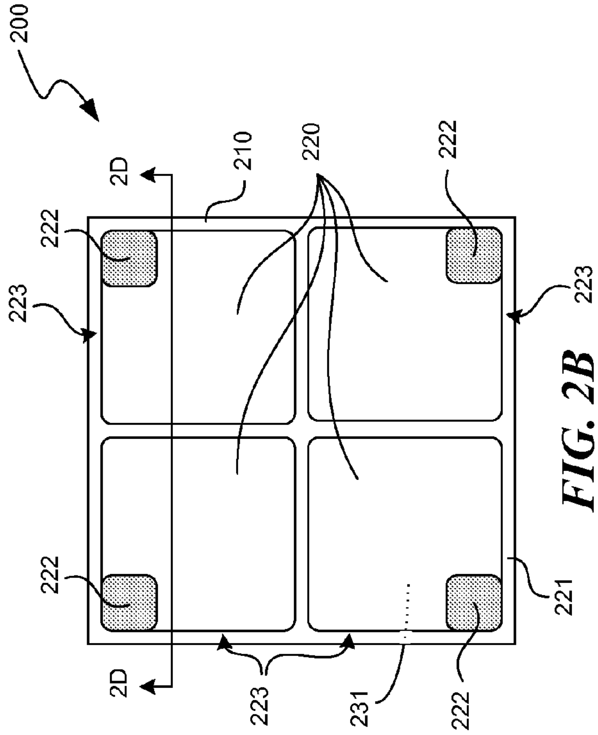
FIG. 2B is a partially schematic top view of a vertical SST device having lighting surface contacts formed thereon to define, at least in part, lighting regions, in accordance with embodiments of the present technology.

FIG. 2B is a partially schematic top view of an SST device 200 having a vertical configuration in accordance with embodiments of the present technology. The device 200 can include a die 210 having first contacts 220 and corresponding bond pads 222 on or at the first contacts 220. The first contacts 220 can be translucent or transparent to permit light to pass outwardly from the die 210. For example, the first contacts 220 can include indium tin oxide. The die 210 can include any suitable light-emitting structure for an SST, such as a p-type gallium nitride ("p-GaN") material, an n-type gallium nitride ("n-GaN") material, and an active region comprising an indium gallium nitride ("InGaN") material between the n-GaN and p-GaN materials, e.g., in the form of multiple quantum wells. The die 210 is generally planar and has a first surface 221, e.g., a lighting surface, through which light is emitted, and a second surface 231, e.g., a nonlighting surface opposite the first surface.

In some embodiments, the first contacts 220 cover a significant portion of the first surface 221 and define, in whole or in part, individual regions or cells 223 of the die 210. For example, in the embodiment shown in FIG. 2B, the SST device 200 has four regions 223 and four corresponding first contacts 220. The underlying die 210 can be generally continuous in a lateral direction from one region 223 to the next. Accordingly, there is no partition between neighboring regions 223, and the regions 223 are defined at least in part (and in some cases, only) by the first contacts 220, as will be described more fully below. In other embodiments, e.g., as described below with reference to FIG. 6B, neighboring regions 223 and in particular, the active regions and associated p-GaN and/or n-GaN may be separated by a partition.

FIG. 2C is a partially schematic bottom view of the SST device 200 according to embodiments of the present technology. The SST device 200 can include a second contact 230 that covers substantially the entire second surface 231 of the die 210. The first contacts 220 (FIG. 2B) and second contact 230 can be plated, patterned, deposited and/or otherwise formed using any suitable technique. In operation, electric current passes through regions of the die 210 between the first contacts 220 (FIG. 2B) at the first surface 221 of the die 210 and the second contact 230 at the second surface 231 to produce light from the individual regions 223 (FIG. 2B) of the die 210. The first contacts 220 can be either n-type or p-type contacts, and the second contact 230 can be the complementary p-type or n-type contact.

Figure 2D:
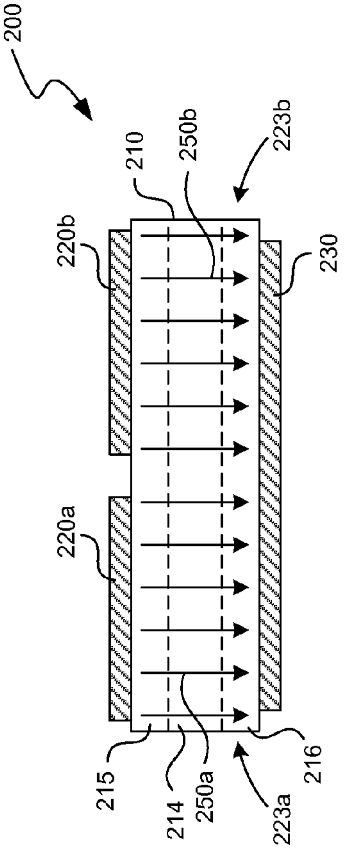
FIG. 2D is a partially schematic cross-sectional view of the SST device shown in FIGS. 2B and 2C, taken substantially along line 2D-2D of FIG. 2B.

FIG. 2D is a partially schematic cross-sectional view of a representative SST device 200 taken generally along line 2D-2D of FIG. 2B. The die 210 includes a first semiconductor material 215, e.g., p-GaN or n-GaN, a second semiconductor material 216, e.g., n-GaN or p-GaN, and a continuous active region 214, e.g., a GaN compound, between the first and second semiconductor materials 215, 216. Individual first contacts 220*a*, 220*b* are spaced apart from each other and are positioned at corresponding individual first and second regions 223*a*, 223*b* of the die 210. Accordingly, a first electrical pathway 250*a* is established at the first region 223*a* of the die 210 between one, e.g., the leftmost, first contact 220*a* and the second contact 230. A second electrical pathway 250*b* is established at the second region 223*b* between a different, e.g., the rightmost, first contact 220*b* and the second contact 230.

As discussed above, in at least some embodiments, the die 210 has no physical partition, e.g., vertical partition, between the neighboring first and second regions 223*a*, 223*b*; rather, the regions 223*a*, 223*b* are defined by the individual first contacts 220*a*, 220*b*, which are separated from each other. In operation, some overlap may exist between the first electrical pathway 250*a* and the second electrical pathway 250*b*, and some electrical current from the first electrical pathway 250*a* may pass through at least a portion of the second region 223*b*, even when the first contact 220*b* corresponding to the second region 223*b* is not activated. In other embodiments, the die 210 can include a physical partition, e.g., a trench or other structural feature, between the regions 223*a*, 223*b*, e.g., in addition to the space between the neighboring first contacts 220*a*, 220*b*. In either embodiment, e.g., even if some current "leaks" from one region to another, the regions 223*a*, 223*b* of the die 210 can be separately or individually controlled. As usual herein, the terms separately controlled and individually controlled mean that an input to one region may be different than an input to another region, and the respective outputs are responsive to the different inputs, even though the inputs may be provided simultaneously. In some embodiments, the inputs to different regions may be independent of each other, and in other embodiments, the input to one region can depend upon the output produced by another region, so that the two inputs are not completely independent. Accordingly, the levels of light produced by each region can be controlled to produce different outputs, or can be controlled to produce similar outputs, with different inputs.

One application of the foregoing technique is for a relatively large die 210 having at least some differential lighting characteristics. For example, a die 210 having two first contacts 220*a*, 220*b*, and two corresponding regions 223*a*, 223*b* may emit light from the first region 223*a* that is not as bright as the light emitted from the second region 223*b* when both regions 223*a*, 223*b* are operating with the same input power. By separately controlling the power applied to each region, the first region 223*a* can be operated at a higher power than the second region 223*b* to achieve a light output the same as or at least closer to the output from the second region 223*b*. Accordingly, the overall output of the die 210 can be more uniform. The SST device 200 can include any of a variety of suitable numbers of regions 223 having any of a variety of suitable shapes, depending on the manner in which the light-emitting characteristics vary from one region to another. For example, in other embodiments described below in greater detail, the shape and positioning of the regions 223 can be based on a desired differential light output from a die 210, e.g., in addition to or independent of accounting for disparate light emitting characteristics from different portions of the die 210.

Figure 2E:
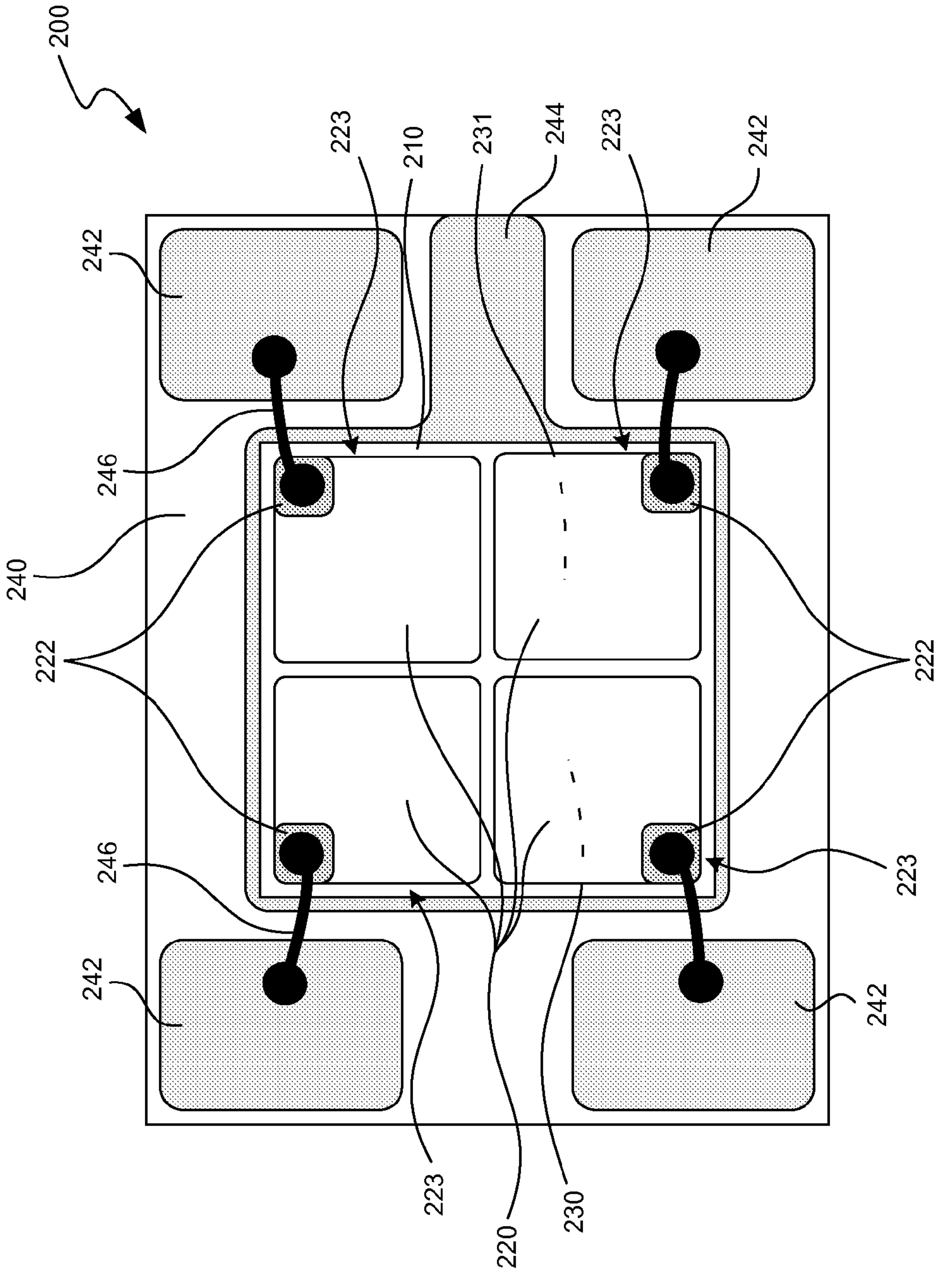
FIG. 2E is a partially schematic top view of the SST device shown in FIGS. 2B-2D, packaged with a support substrate in accordance with embodiments of the present technology.

FIG. 2E is a partially schematic top view of the SST device 200 shown in FIGS. 2B-2D, now incorporated into a package that includes a substrate 240. The substrate 240 can include several first substrate contacts 242 and a second substrate contact 244. The second substrate contact 244, in at least some embodiments, can be a relatively large contact that faces and connects with the second contact 230 of the die 210. The die 210 can be placed with the second surface 231 facing down toward the substrate 240 to create a good electrical connection between the second contact 230 and the second substrate contact 244. The first substrate contacts 242 can be connected to the bond pads 222 of the die 210 with wire bonds 246. Accordingly, separately controllable electrical pathways can be established to separately control the individual regions 223 of the SST device 200, via connections made to the substrate 240. An advantage of this arrangement is that it can provide high-resolution control over the light produced by the SST device 200. At the same time, because the die 210 (and in particular, the active light emitting region of the die 210) can be generally continuous in a lateral direction, the light output of the SST device 200 is greater than the output from a collection of smaller dies that are placed next to each other.

Figure 3B:
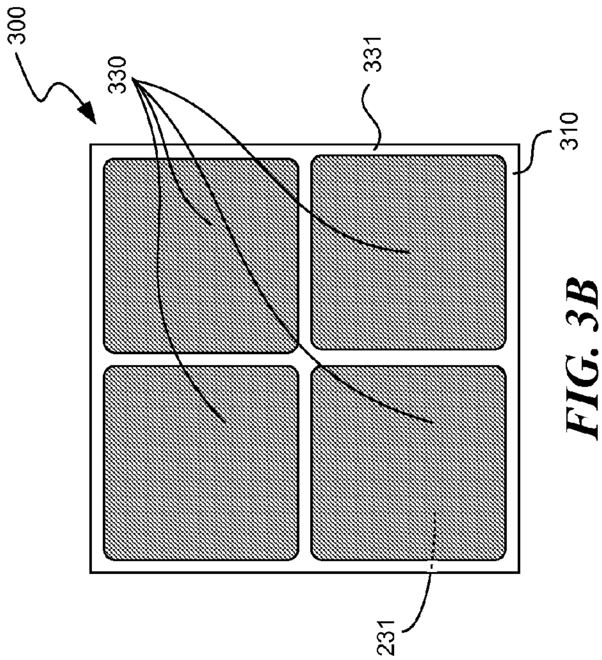
FIG. 3B is a partially schematic bottom view of the SST device of FIG. 3A having individual bottom contacts according to embodiments of the present technology.
Figure 3A:
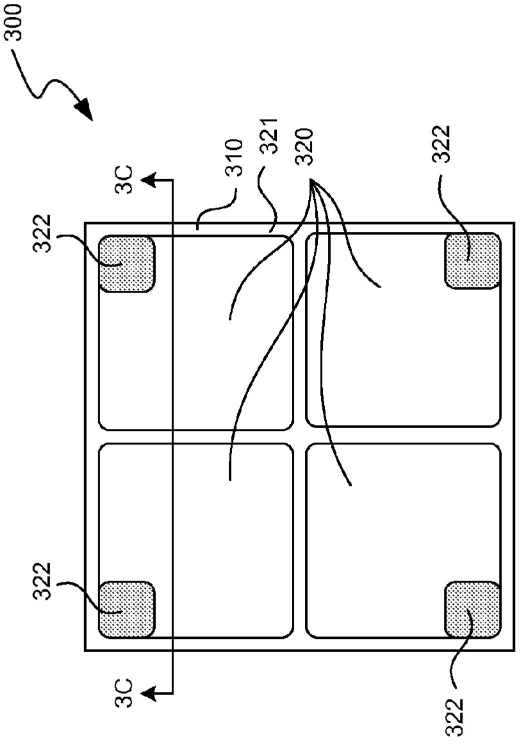
FIG. 3A is a partially schematic top view of a vertical SST device having lighting surface contacts formed to define, at least in part, lighting regions, in accordance with embodiments of the present technology.

FIGS. 3A-3D illustrate several features of an SST device 300 having a vertical configuration and multiple second contacts in accordance with further embodiments of the present technology. FIG. 3A is a partially schematic top view of the SST device 300. The SST device 300 includes a die 310 having a first surface 321 with first contacts 320 and corresponding bond pads 322 having an arrangement generally similar to that discussed above with reference to FIG. 2B. FIG. 3B is a partially schematic bottom view of a second surface 331 of the SST device 300 illustrating corresponding second contacts 330 that are configured generally according to the size and shape of the first contacts 320 (FIG. 3A) at the first surface 321 of the die 310.

Figure 3C:
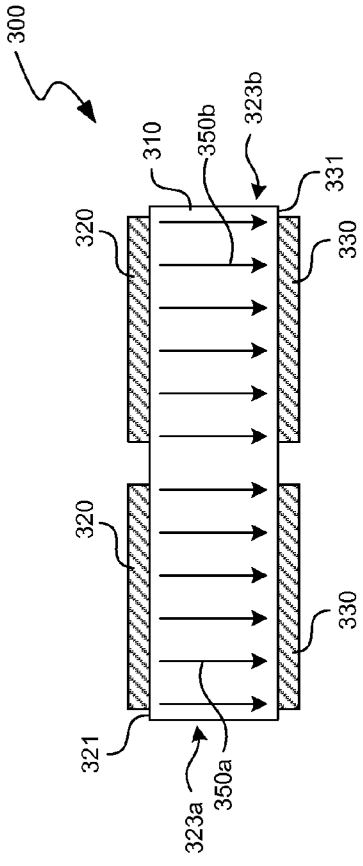
FIG. 3C is a partially schematic cross-sectional view of the SST device shown in FIGS. 3A and 3B, taken substantially along line 3C-3C of FIG. 3A.

FIG. 3C is a partially schematic cross-sectional view of the SST device 300 taken generally along line 3C-3C of FIG. 3A. The device 300 can include separately controllable electrical pathways 350*a*, 350*b* for corresponding regions 323*a*, 323*b* of the die 310, defined by the placement and position of the first contacts 320 at the first surface 321 of the die 310 and the second contacts 330 at the second surface 331. The second contacts 330 are discrete, e.g., spaced apart from each other, and accordingly, this arrangement can further isolate the electrical pathways 350*a*, 350*b* when compared to the electrical pathways 250*a*, 250*b* described above with reference to FIGS. 2B-2E. Conversely, an advantage of the single second contact 230 shown in FIGS. 2B-2E is that it can be simpler and/or cheaper to manufacture.

Figure 3D:
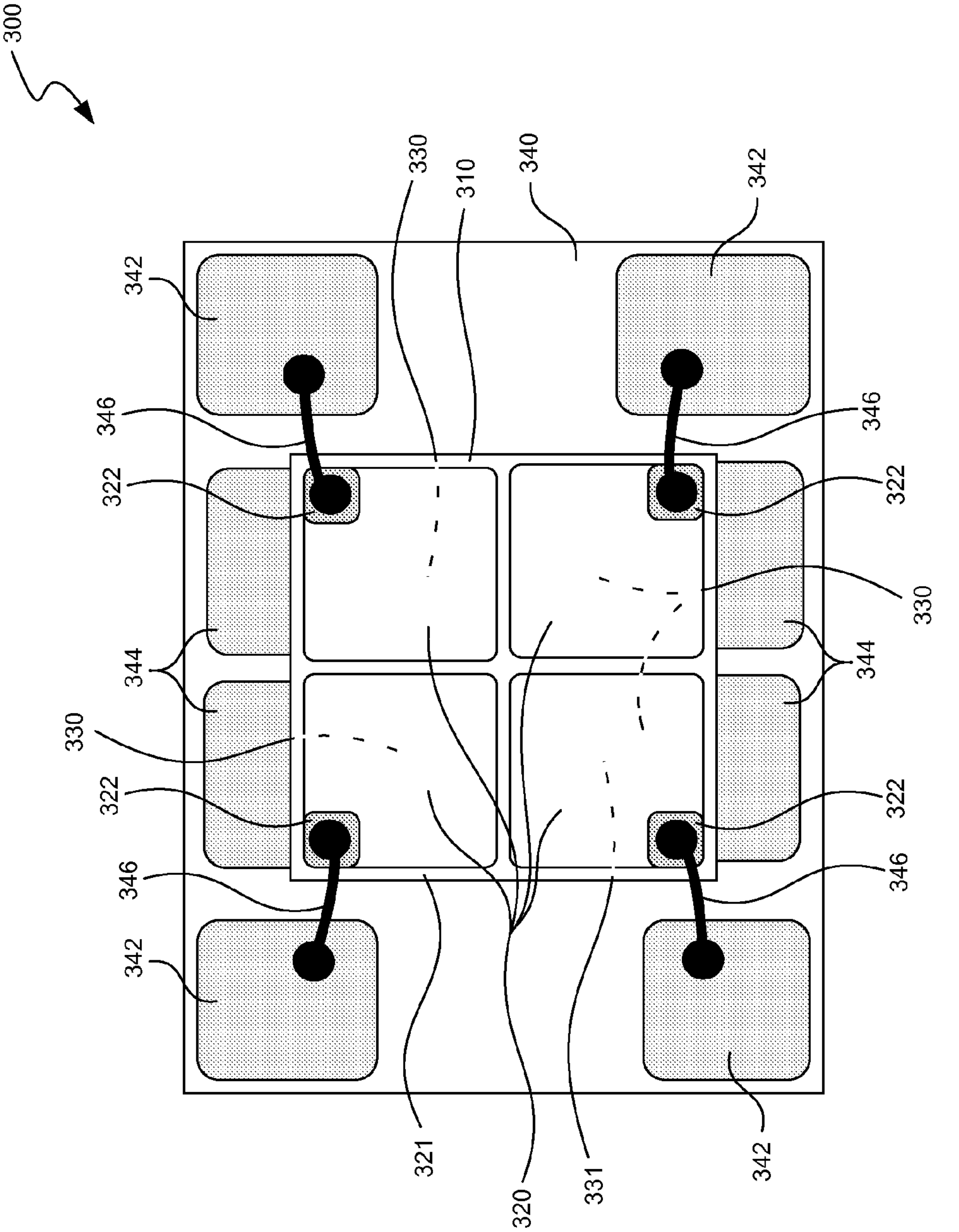
FIG. 3D is a partially schematic top view of the SST device of FIGS. 3A-3C, packaged with a support substrate in accordance with embodiments of the present technology.

FIG. 3D is a partially schematic top view of an SST device 300 that forms part of a package which also includes a substrate 340. The substrate 340 can include first substrate contacts 342, which can be connected via wirebonds 346 or other structures to the bond pads 322 at the first side 321 of the die 310. The substrate 340 can also include second substrate contacts 344 that are electrically isolated from one another at the substrate 340 and are connected to the corresponding second contacts 330 at the second side 331 of the die 310.

Figure 4A:
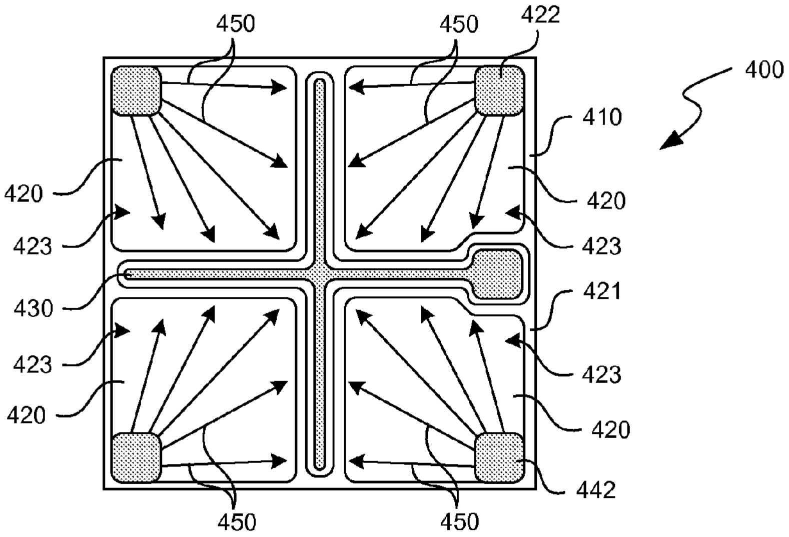
FIG. 4A is a partially schematic top view of a lateral SST device having first and second contacts at or proximate to a lighting surface defining lighting regions in accordance with embodiments of the present technology.

FIG. 4A is a partially schematic top view of an SST device 400 having a lateral configuration in accordance with further embodiments of the present technology. The SST device 400 can include a die 410 having a first side 421, e.g., a light emitting surface, with several first contacts 420 (four are shown in FIG. 4A). The die 410 can also include one or more second contacts 430 (one is shown in FIG. 4A), also on the first side 421 of the die 410. This configuration is generally referred to as a lateral configuration because electrical pathways 450 can be established laterally through corresponding regions 423 of the die 410 located between the first contacts 420 and the second contact 430. The second contact 430 can be a single contact, as shown in FIG. 4A, or it can be one of a plurality of separate contacts. The second contact(s) 430 can have the general form of narrow traces of conductive material that extend between the regions 423 of the die 410. In some embodiments, the shape of the second contact(s) 430 can generally conform to the shape and positioning of the first contacts 420. For example, the single second contact 430 shown in FIG. 4A can have a cross or cruciform shape to be positioned between four first contacts 420. The first contacts 420 can each include a bond pad 422 or other external electrical connection element. For each region 423 of the die 410, a different electric pathway 450 passes through the corresponding region of the die 410 as defined by the first contacts 420. The pathway 450 for any individual region 423 can include any portion of that region 423 between the first contact 420 of that region and the corresponding second contact(s) 430. The second contact 430 can extend partially to the edge of the device 400 to partially isolate neighboring regions 423, or it can extend completely to the edge to fully isolate the regions 423.

Figure 4B:
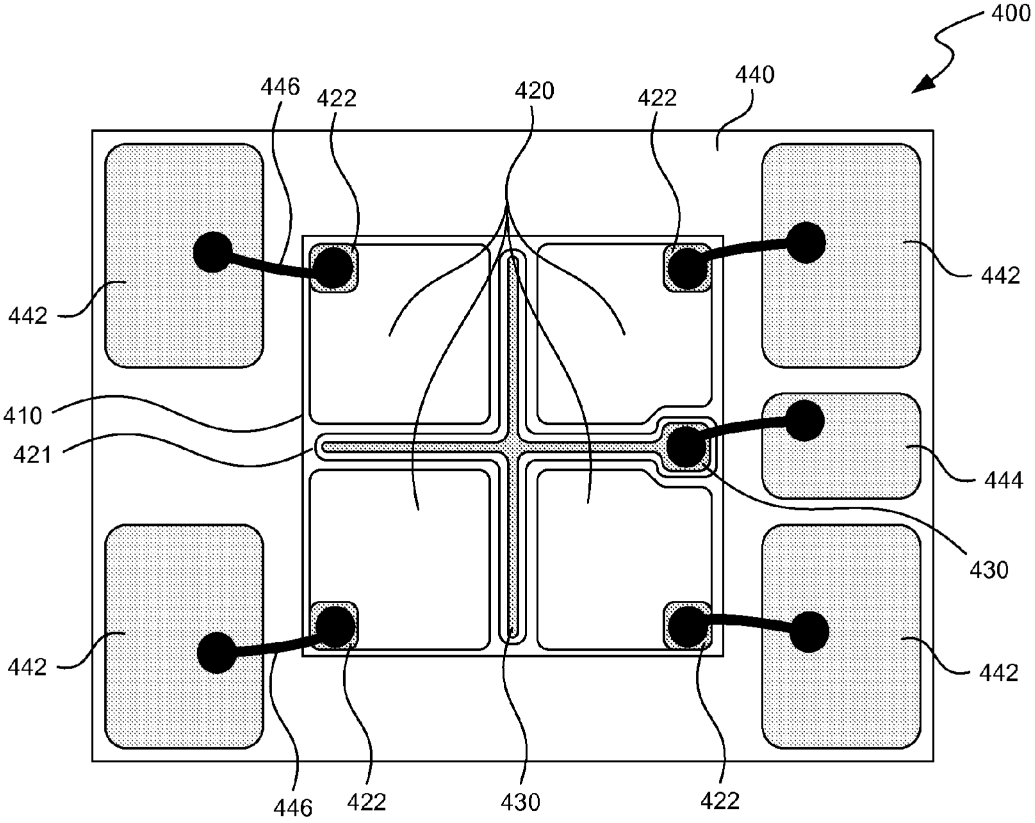
FIG. 4B is a partially schematic top view of the SST device shown in FIG. 4A, packaged with a support substrate in accordance with embodiments of the present technology.

FIG. 4B is a partially schematic top view of the SST device 400 forming part of a package that also includes a substrate 440. Because the contacts for the SST device 400 in the illustrated embodiment are all on the first side 421 of the die 410, the substrate 440 includes first substrate contacts 442 that are laterally spaced apart from the die 410 and are connected with wire bonds 446 or other suitable conductive structures to the bond pads 422. A second substrate contact 444 is connected to the second contacts 430.

FIGS. 5A-5C are partially schematic views of an SST device 500 having a lateral flip configuration in accordance with further embodiments of the present technology. In a lateral flip configuration, the device has laterally spaced apart n-type and p-type contacts, but (unlike the arrangement described above with reference to FIGS. 4A-4C), the contacts are at the second or non-lighting surface of the device. As shown in FIG. 5A, the SST device 500 includes a die 510 having a downwardly facing, light emitting first surface 521 and an upwardly facing non-lighting second surface 531. The die 510 includes multiple spaced-apart first contacts 520 and one or more second contact(s) 530. The first contacts 520 and the second contact(s) 530 can define multiple lighting regions 523 of the die 510. The first contacts 520 and the second contact(s) 530 can have a pattern generally similar to that described above with reference to FIGS.

4A-4B (or another suitable pattern), but because the light from the die 510 is emitted from the downwardly-facing first surface 521, the device is inverted for packaging. In addition, the first contacts 520 and/or the second contact(s) 530 can be made of non-translucent material.

FIG. 5B is a partially schematic top view of a substrate 540 that can be used to package, carry or support the die 510 shown in FIG. 5A. The substrate 540 can include first substrate contacts 542 that correspond generally in shape, size and/or position to the first contacts 520 shown in FIG. 5A, and second substrate contacts 544 that correspond generally in shape, size and/or position to the second contact(s) 530 shown in FIG. 5A. As discussed above, these contacts can be used to separately address the individual regions 523 of the die 510. The die 510 is placed on the substrate 540 with the second surface 531 facing downwardly toward the first and second substrate contracts 542, 544.

FIG. 5C is a partially schematic cross-sectional view taken generally along line 5C-5C in FIG. 5A, showing a first electrical pathway **550*a* and second electrical pathway 550*b* between the first contacts 520 and the second contact(s) 530 according to embodiments of the present technology. As shown in FIG. 5C, the electrical pathways 550*a*, 550*b* and current lines form arcuate patterns between the second contact(s) 530 and the first contacts 520**.

Figure 6B:
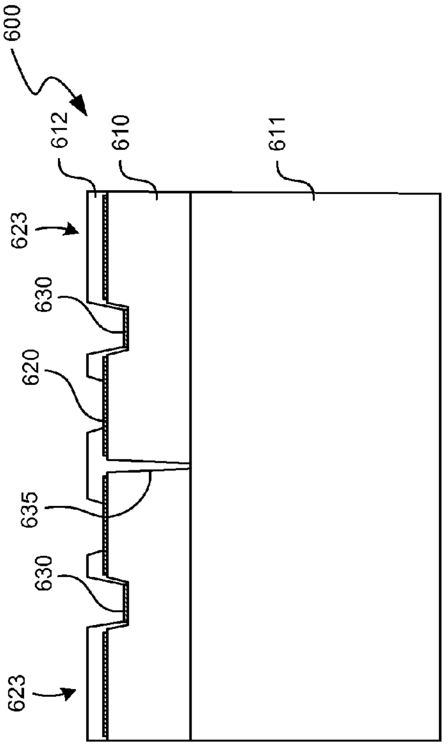
FIG. 6B is a partially schematic cross-sectional view of the SST device shown in FIG. 6A taken substantially along line 6B-6B of FIG. 6A.
Figure 6A:
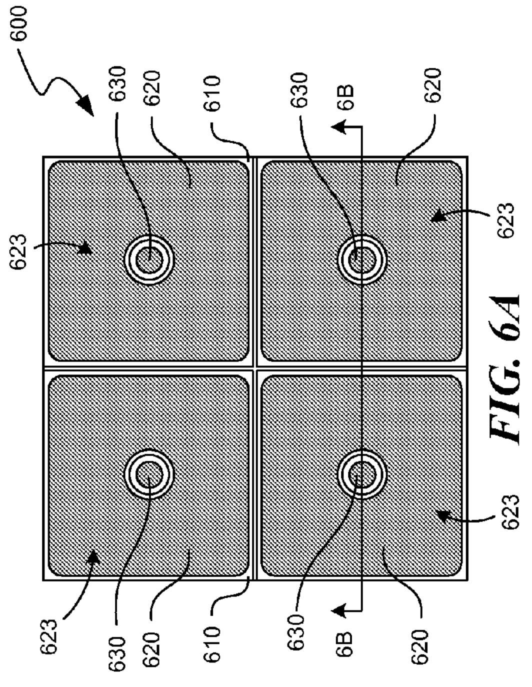
FIG. 6A is a partially schematic bottom view of a lateral flip SST device including first and second contacts at or proximate to a nonlighting surface of the SST device in accordance with embodiments of the present technology.
Figure 6C:
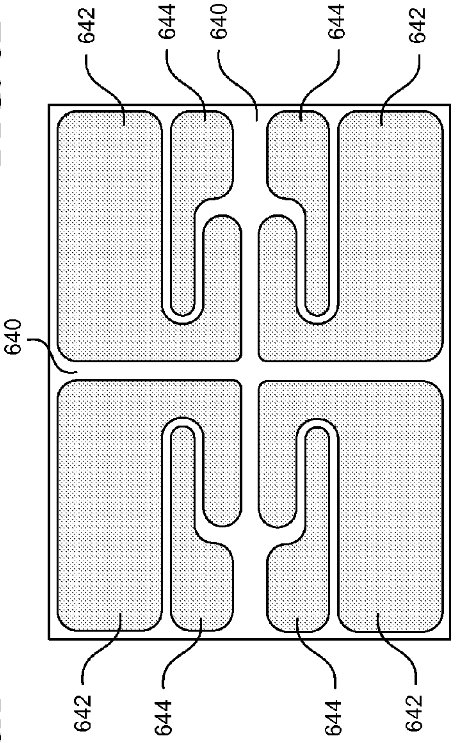
FIG. 6C is a partially schematic top view of a support substrate for use with the SST device of FIGS. 6A and 6B, in accordance with embodiments of the present technology.

FIGS. 6A-6C illustrate still further embodiments of a lateral flip SST device 600 having separate n-type and p-type contacts configured in accordance with embodiments of the present technology. FIG. 6A is a partially schematic bottom view of the SST device 600 including a die 610 having first contacts 620, and second contacts 630. Individual second contacts 630 can be positioned with an annular opening of a corresponding first contact 620 to prevent the contacts from shorting. Each pair of first and second contacts 620, 630 can establish an independent electrical pathway through a region or cell 623 of the die 610. Accordingly, individual regions 623 of the die 610 can be addressed with corresponding individual inputs. The first contacts 620 can be n-type contacts and the second contacts 630 can be p-type contacts, or vice versa.

FIG. 6B is a partially schematic cross-sectional view taken generally along line 6B-6B of FIG. 6A. The active light emitting region of the die 610 can be formed on a growth substrate 611. The second contacts 630 can be recessed from an outwardly facing surface of the die 610. The first contacts 620 can be located at or proximate to the outwardly facing surface of the die 610. To electrically isolate individual first contacts 620 from corresponding individual second contacts 630, a dielectric material 612 can be deposited on the die 610 and in a well, trench or other recess 635 between neighboring regions 623. Accordingly, the dielectric material can form a physical separation between the neighboring regions 623.

FIG. 6C is a partially schematic top view of a substrate 640 for packaging and supporting the die 610 described above with reference to FIGS. 6A and 6B, in accordance with particular embodiments of the present technology. The substrate 640 can include first substrate contacts 642 and second substrate contacts 644 that can receive the die 610 with the bottom or non-lighting side of the die 610 contacting the substrate 640. The first substrate contacts 642 connect to corresponding first contacts 620 of the die 610, and the second substrate contacts 644 connect to corresponding second contacts 630 of the die 610.

Figure 7A:
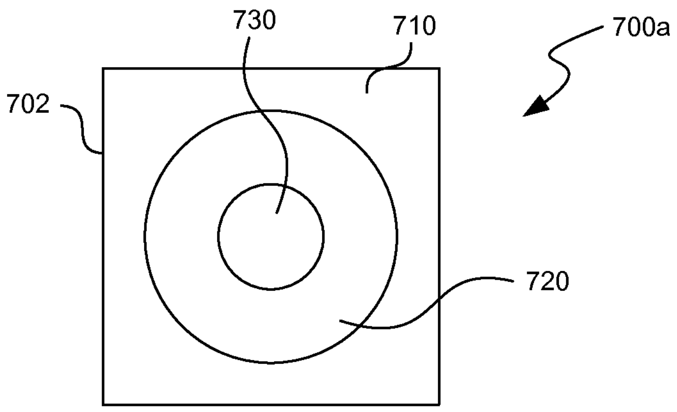
FIG. 7A is a partially schematic top view of an SST device having concentric lighting regions in accordance with embodiments of the present technology.
Figure 7B:
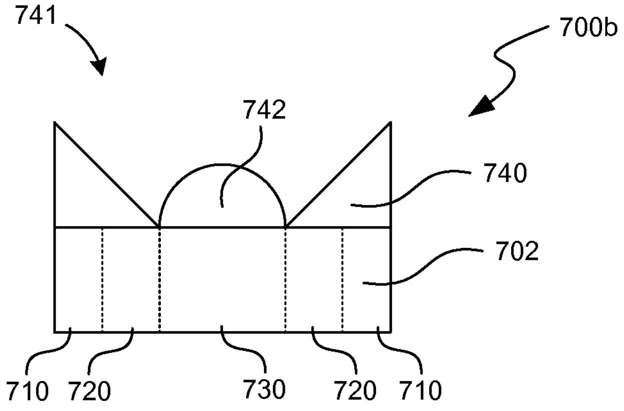
FIG. 7B is a partially schematic side view of the SST device of FIG. 7A, including a spotlight-type lens, in accordance with embodiments of the present technology.
Figure 7C:
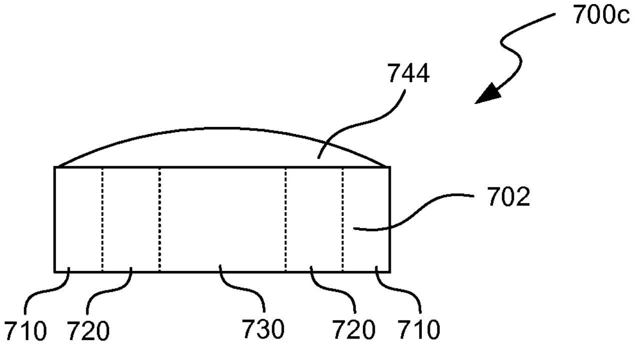
FIG. 7C is a partially schematic side view of the SST device of FIG. 7A including a wide angle-type lens in accordance with embodiments of the present technology.

FIGS. 7A-7C illustrate SST devices that include a die 702 having independently controlled regions defined at least in part by lighting surface contacts in accordance with a further embodiment of the present technology. The size, shape, and position of the contacts and corresponding regions of the die can be selected in accordance with the design constraints presented by any of a variety of applications. FIG. 7A is a partially schematic top view of a device 700*a* having a die 702 with multiple, individually addressable regions. The regions can include a first region 710 comprising a peripheral section of the die 702, an annular or intermediate second region 720, and a third, generally circular region 730 at or near the center of the die 702. The second and third regions 720, 730 can be generally concentric; however, in other embodiments, these regions can have other shapes and/or configurations. As described above, the die 702 can comprise a generally continuous, uniform or monolithic lighting structure, such as an LED having a continuous active region, and the regions 710, 720, and 730 can be defined at least in part by contacts (not shown) that are patterned or otherwise formed on the surface of the die 702, in a manner generally similar to that described above. The regions 710, 720, and 730 can be separately controlled to adjust the light output from the SST device 700*a*, and/or to manage a heat load on the SST device 700*a*, and/or for other suitable reasons. For example, the central third region 730 can receive more power than the first and/or second regions 710, 720 to create a spotlight effect.

The function provided by separately controlling different regions of the die 702 can be enhanced by adding a lens or other passive element to the die 702. FIG. 7B illustrates a partially schematic side view of a device 700*b* in which the die 702 carries a lens 741 that produces or enhances a spotlight pattern obtained by separately controlling the regions 710, 720, 730. The lens 741 can include first lens portion 742 at the center of the SST device 700*b* and a second lens portion 740 toward a periphery of the SST device 700*b*. The lens portions 740, 742 can be positioned to further focus the high intensity light emitted by the third region 730 at the center of the die 702 and/or can focus the lower intensity light from the first and second regions 710, 720.

FIG. 7C illustrates another embodiment of an SST device 700*c* that produces a wide angle light pattern using a lens 744, e.g., in combination with independently controlling the light emitted from different regions of the die 702. In this embodiment, the first region 710 can be operated at a relatively high intensity, the second region 720 can be operated at a moderate intensity, and the third region 730 can be operated at a low intensity, with the wide angle lens 744 further diffusing the light. In other embodiments, SST devices can include other types or shapes of lenses, and the regions of the die 702 can be formed and/or selected to produce a different target light output when combined with the appropriate lens.

Figure 8C:
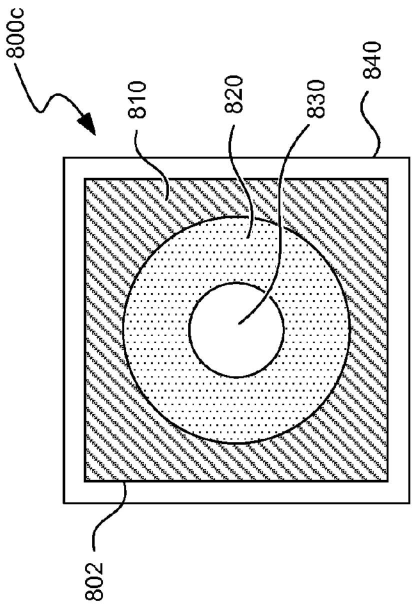
FIGS. 8C and 8D are partially schematic top and side views, respectively, of an SST device having independently controlled lighting regions which are operated at different input levels in accordance with embodiments of the present technology.
Figure 8A:
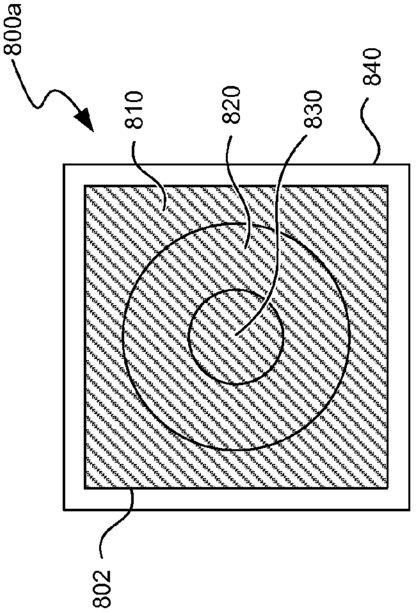
FIGS. 8A and 8B are partially schematic top and side views, respectively, of an SST device having independently controlled lighting regions which are operated at the same input level in accordance with embodiments of the present technology.
Figure 8D:
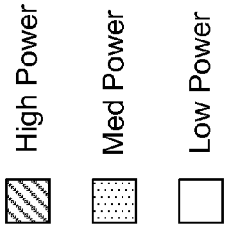
Figure 8D:
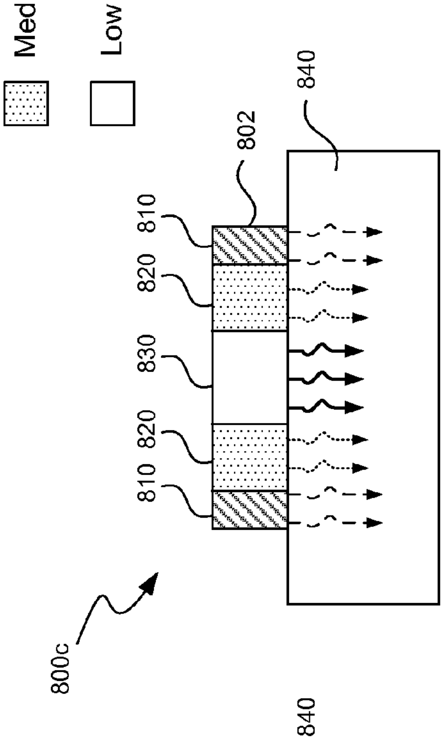
Figure 8B:
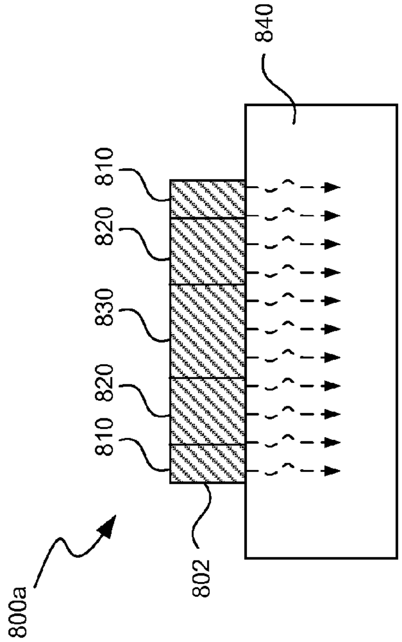

FIGS. 8A and 8B are partially schematic top and side views, respectively, of an SST device 800*a* that includes a die 802 carried by a substrate 840 and having multiple lighting regions, each operated at the same input power. FIGS. 8C and 8D are partially schematic top and side views, respectively, of an SST device 800*c* that includes a die 802 having multiple lighting regions operated at different input powers according to embodiments of the present technology. The SST devices 800*a*, 800*c* can include separately controlled lighting regions to manage heat and/or light produced by the SST devices 800*a*, 800*c*. The SST device 800*a* can include a first region 810, a second region 820, and a third region 830, generally similar to the embodiment shown in FIGS. 7A-C. By operating the regions of the SST device 800*a* at the same power, the output approximates what would occur without the benefit of the individually controlled regions. In particular, the heat builds up in the SST device 800*a*, and if the heat reaches a certain level, the entire SST device 800*a* may need to be turned off to avoid damaging the SST device 800*a*. In contrast, the regions of the device 800*c* can be operated at different levels according to the heat produced at each region to avoid shutting the device 800*c* down.

In general, when a single, monolithic SST device is operated, the heat is dissipated more easily from the periphery of the SST device due to its proximity to the external environment and/or heat-sinks, whereas the center of the die 802 will tend to heat more quickly because its surrounded by the lighting structure material and there are fewer heat-sinks or other heat dissipating media nearby. Accordingly, the first region 810 can be operated at a higher power/intensity than the second region 820, which can in turn be operated at a higher power/intensity than the third region 830 to generate less heat in the third region 830, due to that region's relative inability to dissipate heat. It is to be understood that in other embodiments, the shape, size, number and/or positioning of the regions will vary, e.g., because different heat-sinks and other configurations create different heat transfer patterns at various regions of the SST device. Accordingly, the contacts at individual regions of the die 802 can be shaped according to the available heat-sink capacity in a variety of suitable patterns.

In some embodiments, the die can be used with a system that monitors heat at various regions within or outside the die and controls the input to individual regions in accordance with a measured temperature at or corresponding to the individual regions. For example, the intensity of light produced at individual regions can be raised or lowered according to the heat output of the region in a time-varying manner. The number of regions for each die can be selected to provide a target level of control over where the heat is generated and how it is dissipated.

Figure 8E:
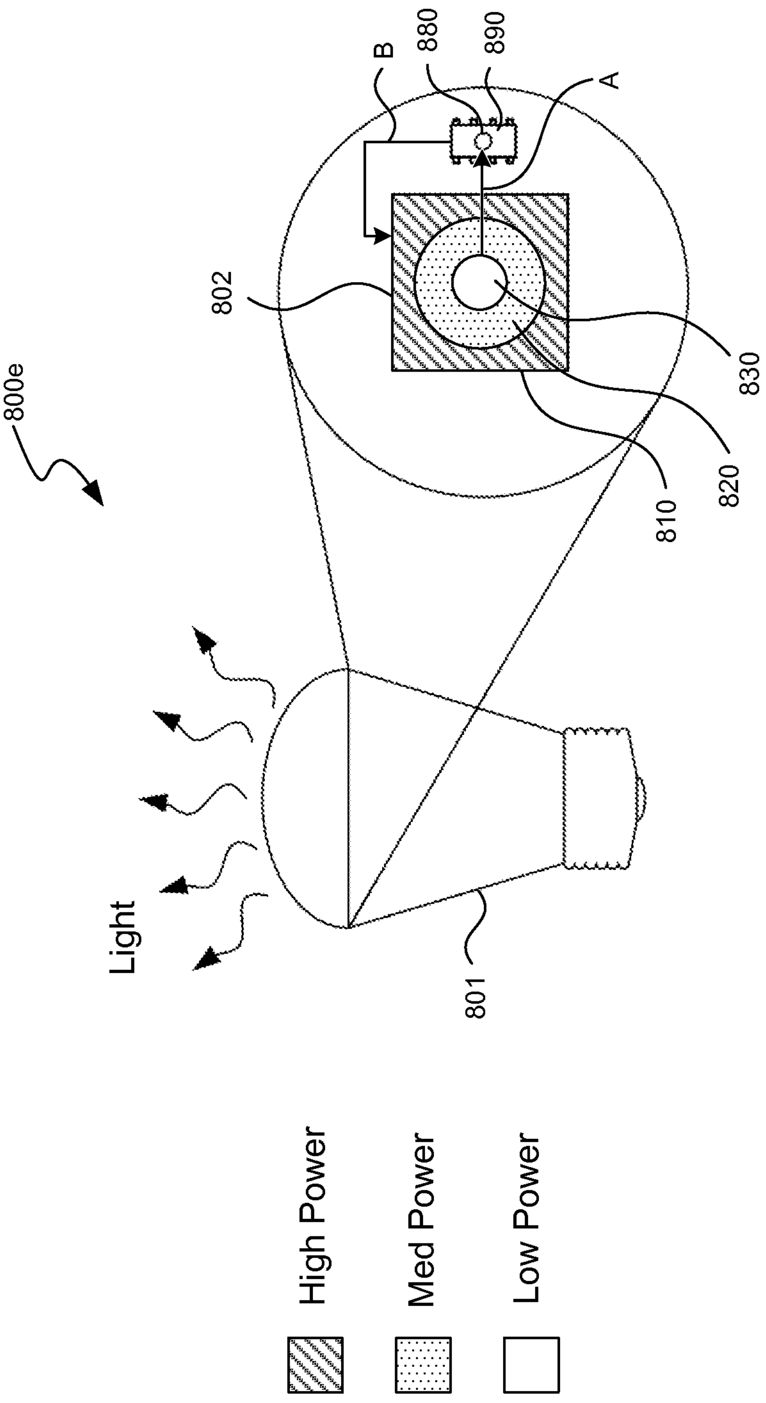
FIG. 8E is a partially schematic illustration of an SST system that includes an SST device, a detector, and a controller.

FIG. 8E is a partially schematic illustration of an overall SST system 800*e* that includes a light 801 in which is positioned at least one die 802 having multiple, separately controllable regions configured in accordance with any of the foregoing embodiments. In a particular embodiment shown in FIG. 8E, the regions include the concentric first, second, and third regions 810, 820, 830 described above with reference to FIGS. 8A-8D.

The system 800*e* can further include a detector 880 that receives an input corresponding to an operational characteristic of the die 802, as indicated by arrow A. For example, the detector 880 can include one or more photodetection elements that receive light from the die 802 and can output a signal indicative of a characteristic of the light, for example, an intensity of the light. In other embodiments, the detector 880 can include one or more heat sensors that provide an output signal corresponding to the heat generated by the die 802. In any of these embodiments, the output signals from the detector 880 can be directed to a controller 890 that in turn processes the signal and, based at least in part upon the information conveyed by the signal, can issue directions to the die 802, as indicated by arrow B. For example, the controller 890 can include a processor programmed with instructions that, when executed, control the amount of power provided to each of the multiple regions of the die 802. Accordingly, the controller, e.g., the processor, can include automatically executed instructions that perform any of the foregoing tasks. In particular embodiments, an individual detector can perform multiple, different, functions, and/or can be one of multiple detectors that together perform similar or different functions.

FIGS. 9A-9D illustrate an SST device array 900 operating in accordance with a prior art technique to account for a characteristic of red SST devices used in the context of a larger SST device array. Existing red SST devices tend to lose efficiency, and therefore intensity, once they reach a steady state temperature. To account for this effect, red SST devices are selected to have a relatively higher color intensity to offset the anticipated loss of efficiency after start up. As a result, when an SST array is started, but before the array reaches a steady state temperature, the light produced by the array will tend to be more red than desired. One existing approach to account for this is described below with respect to FIGS. 9A-D.

Figure 9A:
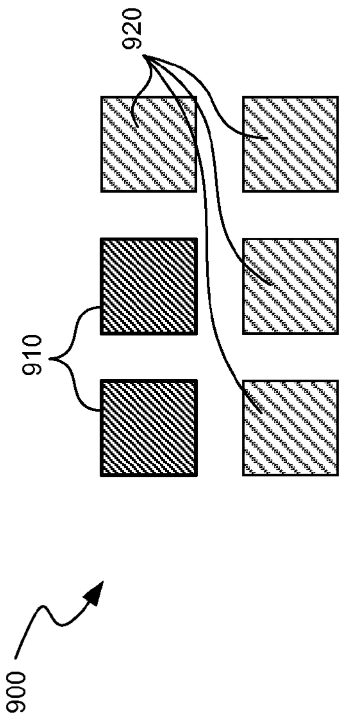
FIGS. 9A-9D illustrate an SST device array configured in accordance with the prior art.

FIG. 9A illustrates an SST device array 900 that, for purposes of explanation, has six dies. The array 900 includes two red SST devices 910 and four non-red SST devices 920 which together, at steady state temperature, produce a desired light output, such as a white light output. As shown in FIG. 9A, before the array 900 reaches a steady state temperature, the red SST devices 910 emit light at a greater intensity than is suitable for producing a target output color or chromaticity.

Figure 9B:
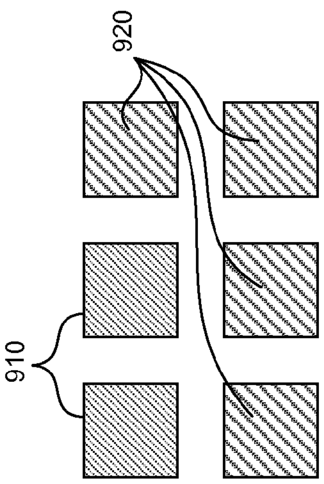
Figure 9C:
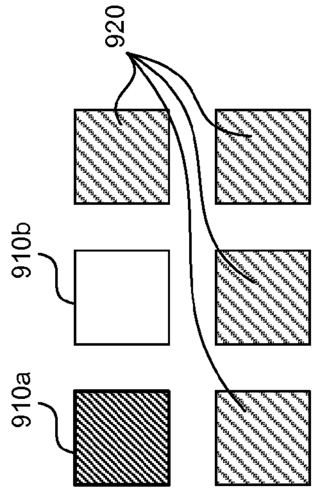
Figure 9D:
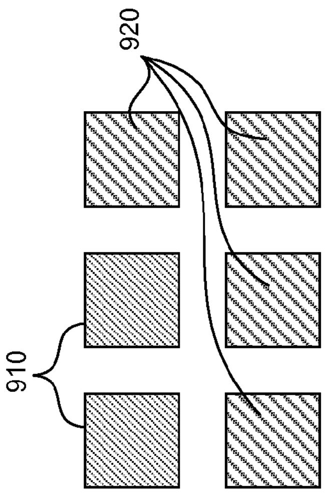

FIG. 9B shows the array 900 after reaching a steady state temperature at which point the red SST devices 910 have lost some efficiency and have reached the desired color intensity to achieve the target overall chromaticity for the array 900. One prior art solution is shown in FIG. 9C. At initiation, rather than powering both of the red SST devices 910, a first red SST device 910*a* can be powered while a second red SST device 910*b* is not. The other non-red SST devices 920 can be powered and the array 900 will begin warming up. By leaving the second red SST device 910*b* switched off, the red component of the overall light output is provided only by the first red SST device 910*a* and, accordingly, the red component of the overall light output is lower and therefore closer to the desired overall chromaticity. After some time period, but before reaching the steady state temperature, the second red SST device 910*b* is powered. FIG. 9D illustrates the array 900 after it reaches the steady state temperature and after all the SST devices are operating at their steady state levels. While this approach produces the target chromaticity, the resolution with which it adjusts the light output is low.

Figure 10B:
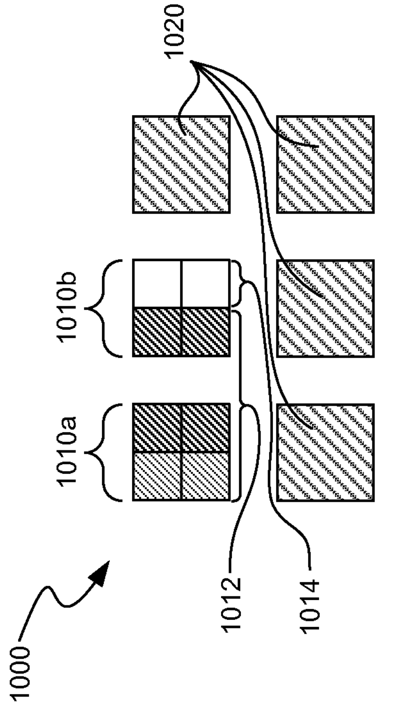
FIGS. 10A-10C illustrate an SST device array having individual SST devices that include two or more independently controlled lighting regions in accordance with embodiments of the present technology.
Figure 10A:
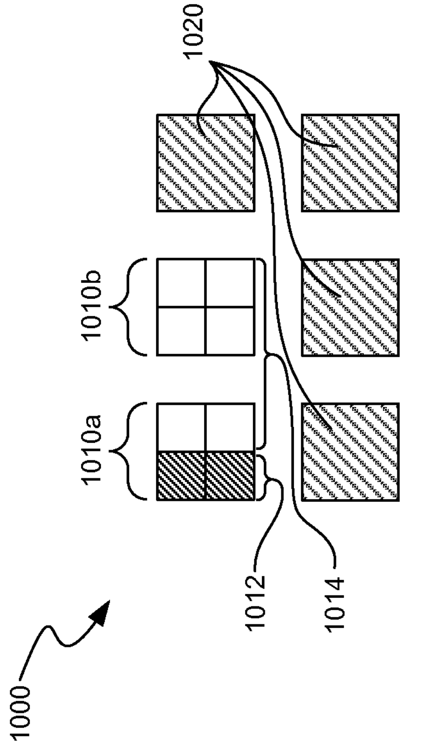
Figure 10C:
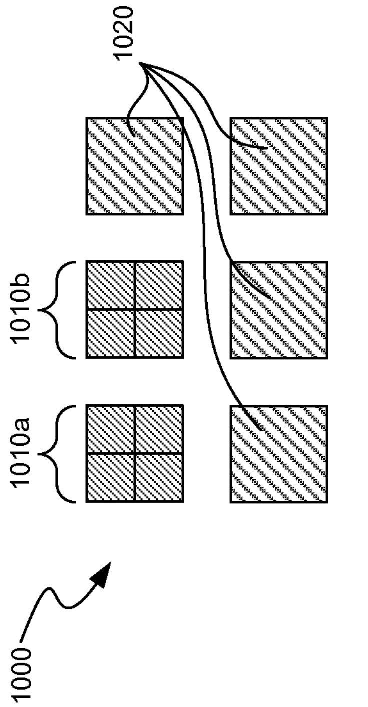

FIGS. 10A-10C illustrate an array 1000 of SST devices having independently controlled lighting regions operated in accordance with particular embodiments of the present technology. The array 1000 includes a first SST device 1010*a*, a second red SST device 1010*b*, and four non-red SST devices 1020. Each of the red SST devices 1010*a*, 1010*b* can include a plurality of separately controlled regions, e.g., four as shown in FIG. 10A. The non-red SST devices 1020 may or may not have separately controllable regions, according to the design requirements of a given application.

When the array 1000 is first powered up, fewer than all the available red regions are activated. Accordingly, the array 1000 includes active red regions 1012, e.g., two such regions, and inactive red regions 1014, e.g., six such regions. By operating fewer than all the red regions, e.g., less than an entire red SST device, the amount of red light produced by the red SST devices 1010*a* and 1010*b* can be less than is produced by operating the same red SST devices at their full operating capacity. The number of initially active red lighting regions 1012 and inactive regions 1014 can be selected based on the desired output chromaticity of the array 1000. The non-red SST devices 1020 can be powered at this time, or at a slightly earlier or later time. The total light output from the array 1000, including the relatively high output from the active red lighting regions 1012, can more closely match a desired overall chromaticity than would result by powering the entire first and/or second red SST device 1010*a*, 1010*b* as described above with respect to FIGS. 9A-9D. Accordingly, the separately or individually controllable regions of the red SST devices 1010*a* and 1010*b* offer improved color over a range of brightness levels. Unlike a dimmer-controlled incandescent light, SST devices in general have a minimum power below which they do not produce light. Selectively turning on and off particular regions of the device can provide an acceptable dimmer function despite this characteristic of SST devices.

FIG. 10B shows the array 1000 after the initially powered red lighting regions have begun reducing output due to increased temperatures. Such regions are indicated by lighter hatching in FIG. 10B. Additional lighting regions have accordingly been activated to account for the foregoing reduction. FIG. 10C illustrates the SST device array 1000 after reaching the steady state operating temperature. At this point, all or substantially all the lighting regions of the red SST devices 1010*a*, 1010*b* are powered and have undergone thermally induced output reduction. At any given point during the foregoing process, a sufficient number of active red lighting regions 1012 are activated to produce, in combination with the non-red SST devices 1020, an output chromaticity approximately equal to a target steady state output chromaticity. As each independently controlled lighting region of a red SST device 1010*a*, 1010*b* reaches the steady state operating temperature, its intensity drops and more independently controlled lighting regions are activated. The SST devices can include any suitable number of separately controllable regions, so the control over the output chromaticity can be fine-tuned to a desired, e.g., high, resolution. Accordingly, the overall output chromaticity from the array 1000 can more closely match a desired output chromaticity even before the array 1000 reaches the steady state temperature.

In some embodiments, the separately controlled regions can be adjacent to each other, as shown in FIGS. 10A-10C. In other embodiments, regions can be distributed in other manners. For example, these initially powered lighting regions can be surrounded by initially unpowered lighting regions so the heat generated at the powered lighting regions will at least partially warm the as-yet unpowered lighting regions. In other embodiments, different regions can be turned on and off multiple times in a random or deliberate process to gradually increase the number of powered regions until the lighting structure approaches the steady state temperature. At each point in time, the number of powered lighting regions is chosen to closely match the desired output chromaticity taking into consideration the artificially high output from red SST devices that have not yet reached the steady state temperature.

From the foregoing it will be appreciated that specific embodiments of the disclosed technology have been described herein for purposes of illustration, but that various modifications may be made without deviating from the disclosure. For example, the shape, size, and positioning of the independently controlled regions can vary depending on the particular application. Additionally, different materials may be used in place of those described herein, or additional components may be added or removed. Connections between elements can be made with structures other than those described above, e.g., other than wire bonds, in other embodiments. Certain arrangements described above in the context of a single die can apply to multiple die in other embodiments. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Accordingly, the disclosure and associated technology can encompass other embodiments not expressly shown or described herein.

I claim:

1. A solid state transducer device, comprising: a transducer structure having: a first semiconductor material having a planar active surface; a second semiconductor material; a light-emitting active region between the first and second semiconductor materials, the active region including a continuous portion having a first region and a second region; a first side; and a second side facing away from the first side; a first contact electrically connected to the first semiconductor material to direct a first electrical input to the first region along a direct, linear first path; a second contact spaced apart from the first contact and electrically connected to the first semiconductor material to direct a second electrical input, distinct from the first electrical input, to the second region along a direct, linear second path different than the first path; and a common third electrical contact electrically and physically connected to the second semiconductor material and electrically coupled to both the first and second regions to receive electrical current along both the first and second paths, wherein: the first and second contacts are each separated from the third contact by the same distance, the first and second contacts are positioned on the planar active surface at the first side of the transducer structure and the transducer structure is configured to emit light from the active region through the first side of the transducer structure.

2. The device of claim 1 wherein the transducer structure is a single singulated die.

3. The device of claim 1, further comprising a substrate carrying the transducer structure.

4. The device of claim 1, further comprising a controller coupled to the first and second contacts, the controller being programmed to direct signals separately to each of the first and second contacts.

5. The device of claim 4 wherein the controller is programmed with instructions for directing signals to one of the first and second regions based at least in part on an output characteristic of the other of the first and second regions.

6. The device of claim 5 wherein the output characteristic includes an indication of heat produced by at least one of the first and second regions.

7. The device of claim 5 wherein the output characteristic includes an indication of light intensity by at least one of the first and second regions.

8. The device of claim 1 wherein the transducer structure forms at least a portion of an LED die, and wherein the first semiconductor material includes one of an n-GaN material and a p-GaN material, the second semiconductor material includes the other of the n-GaN material and the p-GaN material, and the active region includes multiple quantum wells that in turn include GaN.

9. The device of claim 1 wherein at least one of the first and second regions at least partially surrounds the other.

10. The device of claim 1 wherein the third contact is positioned on the second side of the transducer structure.

11. A solid state LED system, comprising a singulated LED die having: a first semiconductor material having a planar active surface; a second semiconductor material; a light-emitting active region between the first and second semiconductor materials, the active region including a continuous portion having a first region and a second region; a first contact electrically connected to the first semiconductor material to direct a first electrical input to the first region along a linear, unobstructed first path; a second contact spaced apart from the first contact and electrically connected to the first semiconductor material to direct a second electrical input, distinct from the first electrical input, to the second region along a linear, unobstructed second path different than the first path; a common third electrical contact electrically and physically connected to the second semiconductor material and electrically coupled to both the first and second regions to receive electrical current along both the first and second paths; and a controller coupled to the first and second contacts and configured to control the first and second electrical inputs directed to the first and second regions of the singulated LED die, wherein: the first semiconductor material, the second semiconductor material, and the light-emitting active region define a transducer structure having a first side and a second side facing away from the first side; the first and second contacts are each spaced apart from the third contact by the same distance; the first and second contacts are positioned on the planar active surface at the first side of the transducer structure; and the transducer structure is configured to emit light from the active region through the first side of the transducer structure.

12. The system of claim 11, further comprising:
- a detector positioned to receive at least one of radiation and heat emitted by the die; and
- a processor coupled between the detector and the first and second contacts, the processor being programmed with instructions that, when executed:
  - receive a signal from the detector corresponding to an operational characteristic of the LED die; and
  - at least in response to the signal, direct a first electrical input to the first contact at a first power level and direct a second electrical input to the second contact at a second power level different than the first.

13. The device of claim 1 wherein the direct, linear first and second paths are unobstructed paths.

14. The device of claim 1 wherein at least one of the first contact and the second contact are translucent or transparent to light emitted from the active region.

15. A solid state transducer device, comprising: a transducer structure having: a first semiconductor material having a planar active surface; a second semiconductor material; a light-emitting active region between the first and second semiconductor materials, the active region including a continuous portion having a first region and a second region; a first side; and a second side facing away from the first side; a first contact electrically connected to the first semiconductor material to direct a first electrical input to the first region along a direct, linear first path; a second contact spaced apart from the first contact and electrically connected to the first semiconductor material to direct a second electrical input, distinct from the first electrical input, to the second region along a direct, linear second path different than the first path; and a common third electrical contact electrically and physically connected and directly attached to the second semiconductor material, wherein: the first and second contacts are positioned on the planar active surface of the transducer structure, the third electrical contact is electrically coupled to both the first and second regions to receive electrical current along both the first and second paths, and the transducer structure is configured to emit light from the active region through the first side of the transducer structure.

16. The device of claim 15 wherein the first and second contacts are each spaced apart from the third contact by the same distance.

* * * * *